United States Patent [19]

Knapp

[11] Patent Number: 4,920,067
[45] Date of Patent: Apr. 24, 1990

[54] PROCESS FOR II-VI COMPOUND EPITAXY

[76] Inventor: Jamie Knapp, 3909 E. Hampton Pl., Tuscon, Ariz. 85712

[21] Appl. No.: 253,609

[22] Filed: Oct. 5, 1988

[30] Foreign Application Priority Data

Oct. 7, 1987 [IL] Israel .......................... 84118

[51] Int. Cl.⁵ .................. H01L 21/20; H01L 21/203; H01L 21/205; H01L 21/208
[52] U.S. Cl. ........................ 437/81; 437/119; 437/238; 437/2; 437/3; 437/5; 437/129; 437/130; 437/133; 437/126; 437/127; 118/70; 148/DIG. 101; 148/DIG. 118; 204/192.1; 204/192.23
[58] Field of Search ............ 148/DIG. 101, DIG. 118; 118/70; 357/16, 17, 19; 437/119, 238, 250, 925, 962, 2, 3, 5, 129, 130, 133, 126, 127, 81; 372/43; 204/192.1, 192.12, 192.15, 192.16, 192.22, 192.23

[56] References Cited

U.S. PATENT DOCUMENTS

| | | | |
|---|---|---|---|
| 3,933,538 | 1/1976 | Akai et al. | 437/120 |
| 3,959,045 | 5/1976 | Antypas | 437/86 |
| 4,114,257 | 9/1978 | Bellavance | 437/60 |
| 4,121,238 | 10/1978 | Bachmann et al. | 357/16 |
| 4,147,571 | 4/1979 | Stringfellow et al. | 437/128 |
| 4,255,755 | 3/1981 | Itoh et al. | 427/130 |
| 4,287,485 | 9/1981 | Hsieh | 437/129 |
| 4,372,791 | 2/1983 | Hsieh | 437/129 |
| 4,547,230 | 10/1985 | Hawrylo | 437/91 |
| 4,661,176 | 4/1987 | Manasevit | 437/126 |
| 4,849,373 | 7/1989 | Knight et al. | 437/129 |

FOREIGN PATENT DOCUMENTS 0130487 11/1977 Japan .
0172292 10/1983 Japan .
0291484 12/1986 Japan .

*Primary Examiner*—Brian E. Hearn
*Assistant Examiner*—M. Wilczewski
*Attorney, Agent, or Firm*—Fleit, Jacobson, Cohn, Price, Holman & Stern

[57] ABSTRACT

$Hg_{1-x}Cd_xTe$, $Hg_{1-x}Zn_xTe$ and other related II-VI ternary semiconductor compounds are important strategic materials for photovoltaic infrared detector applications. Liquid phase epitaxy employing a tellurium-rich molten nonstoichiometric solution is an accepted technology for thin film epitaxial crystal growth.

This present invention describes a crystal growth process employing specially encapsulated graphite components which directly facilitate a high volume, high quality large area epitaxial layer production.

8 Claims, 3 Drawing Sheets

TYPICAL $Hg_{1-x}Cd_xTe$ EPILAYER

TYPICAL EPILAYER/SUBSTRATE METALLURGICAL INTERFACE

EPILAYER MICROMORPHOLOGY

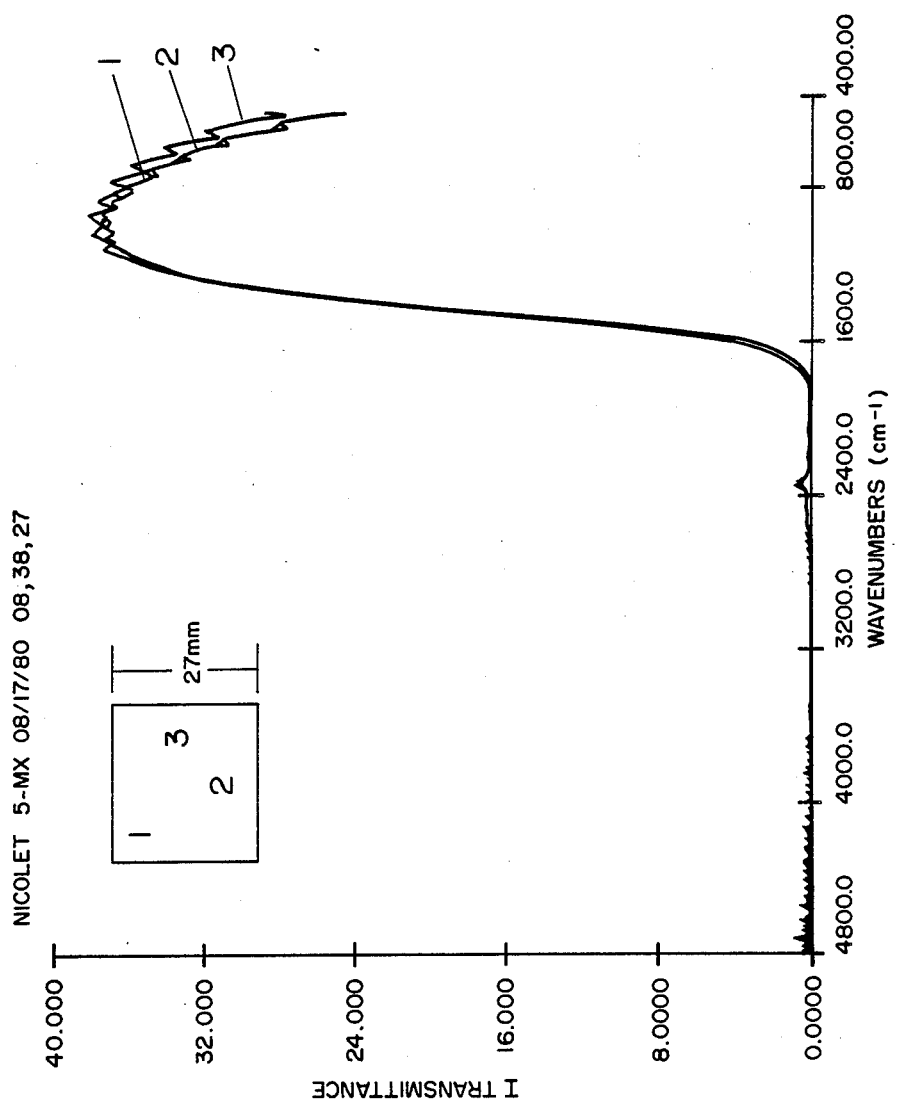
FIG. 7 TYPICAL COMPOSITIONAL UNIFORMITY MEASURED AT 300K VIA INFRARED TRANSMISSION SPECTROSCOPY (CUT-OFF AT 50% AT 77K = 11.0 ± 0.03μm)

PROCESS FOR II-VI COMPOUND EPITAXY

BACKGROUND OF THE INVENTION—PRIOR ART

The infrared sensitive materials $Hg_{1-x}Cd_xTe$ and $H_{1-x}Zn_xTe$ are used in the production of photovoltaic mosaic focal plane arrays since their fundamental absorption edges can be adjusted to coincide with atmospheric window wavelengths (3–5 micron and 8–12 micron) by a suitable choice of the composition x. Thin layers of these materials may be grown epitaxially upon CdTe or upon related alternative substrates via liquid phase epitaxy at atmospheric pressure from a tellurium-rich molten solution (ref.Harman). Such single-film and multi-film crystalline layers are advantageous for the production of monolithic and hybrid $Hg_{1-x}Cd_xTe$ and $Hg_{1-x}Zn_xTe$ detectors and CCD's. For cost-effective focal plane array production, high quality epitaxial layers of these substances grown on a large area (greater than 675 $mm^2$) single-crystal substrates are demanded; growth processes must inherently produce such films with high reliability, reproducibility, yield and throughput.

Generally, graphite growth susceptors of a wide variety of designs (Ref: Bowers, et al) are employed for such LPE growths. As the demand for the reproducible high-rate manufacture of large area II–VI single and multifilm epilayers increases, the growth apparatus subsequently becomes larger and more complex.

Having many desirable physical, chemical and thermal properties, graphite is a popular and widely employed LPE boat material.

For the advanced application to II–VI compound semiconductor epitaxy though, raw graphite has certain drawbacks, which are apt to lead to a reduced throughput of epitaxial material and in an undesirably high rate of graphite component rejection.

Owing to its viscosity and surface tension characteristics, molten tellurium-rich growth solutions tend to physically wick between mated, slidable graphite growth components. This phenomenon becomes complicated when growth fixtures are more and more complex, and when growth solutions become larger and larger in order to accommodate sizable area substrate materials. Upon cooling, the apparatus following LPE growth, physical adhesion of solidified melt material onto graphite surfaces frequently occurs. This phenomenon is aggravated by graphite having a relatively porous surface.

Oftentimes, the wafer physically adheres to the graphite susceptor, risking damage upon removal. The excessive need for graphite repurification and handling is likely to lower the purity of subsequent products and risks damage to delicate boat components. Overall reliability, throughput and yield of the products suffer. In addition, since II–VI epitaxial growths employing mercury require that evaporative mercury loss be controlled and prevented, it is essential that all surfaces of graphite growth fixtures mate with the highest machinable perfection. Graphite surfaces must be smooth and free of defects in order to additionally encourage thorough melt decantation following epitaxial growth. Being a relatively soft material, graphite surfaces are easily damaged and abraded during repetitive growth processes. Carbon particles may be shed because of such poor abrasion resistance. To overcome these drawbacks while maintaining the overall advantageous characteristics of graphite, encapsulants or coatings are typically applied to graphite LPE components.

Some of the conventional coatings are:

1. Vapor deposited pyrolytic carbon films:

For applications including bulk crystal growth, zone refining and liquid phase epitaxy, this coating was developed in order to eliminate the effect of carbon contamination and excessive graphite dusting. It is stable in oxidizing atmospheres at up to 450° C. and is not wetted by most molten metal and molten salt solutions. Unfortunately, the micromorphology of this coating often contains miniscule imbedded particulates, and therefore the close fit between tightly mated graphite components is reduced. Internal corners of machined graphite products become slightly filled with coating material, lowering the precision and accuracy of dimensions. These pyrolytic coatings also have poor abrasion resistance and a tendency to peel from the underlying graphite.

2. Glassy carbon coating:

This coating is mechanically applied and subsequently baked. Generally, micromorphology is quite poor and internally machined corners are filled with coating.

3. Vapor deposited boron nitride:

Although having suitable chemical, physical and thermal properties, this encapsulation is quite non-uniform in thickness and has an inadequately rough surface morphology.

4. Evaporated coatings of $SiO_x$:

This coating technique has been employed where excessive wetting by molten metallic solutions in metallurgical applications is to be eliminated. As experienced by Hass, et al.. the direct evaporation of silicon dioxide $SiO_2$ is difficult because of the extreme temperatures involved. $SiO_2$ films tend to have doubtful protective qualities because of loose structure. Evaporated films of $SiO_x$ (x is oftentimes greater than 1 since it is difficult to avoid the incorporation of extra oxygen into the relatively unstable Si—O bond when evaporation is performed under a non-ideal vacuum)tend not to have adequate adhesion to graphite components if thick (greater than 10,000 Angstroms). If thinner, such coatings generally have a poor abrasion resistance. Such thin films (5000–9000 Angstroms) easily abrade and create dust when tightly contacted graphite components move against one another, causing limited graphite lifetime and a need to reapply the $SiO_x$ coating often. $SiO_x$ particulates may interfere with the purity of the process. Furthermore, if internal cavities and machined recesses need to be uniformly coated, evaporation techniques frequently coat in a non-homogeneous manner since it is a "line-of-sight" deposition technology. Purity also is oftentimes threatened since, possibly, impurities outgassing from the evaporationsource heating elements, may become incorporated into the evaporated films.

SUMMARY OF THE INVENTION

The invention relates to an improved process for the production of epitaxial layers of II/VI compound semiconductors. The invention further relates to the production of improved $Hg_{1-x}Cd_xTe$ and $Hg_{1-x}Zn_xTe$ and other ternary semiconductor compounds in the form of epitaxial layers on a suitable substrate.

The invention further relates to such products which are of use in the production of IR photovoltaic detectors. The invention relates to improvements of the conventional technology of liquid phase epitaxy using a tellurium-rich molten solution with a suitable growth apparatus, generally machined from graphite.

According to the present invention there is provided a considerably improved process based on the use of graphite susceptor devices where the graphite surfaces exposed to the reactants are provided with an RF-sputtered coating of essentially pure and uniform SiO(silicon monoxide). The use of this specific coating results in considerably improved products and reduced rejection rates.

DESCRIPTION OF THE DRAWINGS

The invention is illustrated with reference to the enclosed schematical drawings which are not according to scale and in which:

FIG. 7 is a graph demonstrating typical compositional uniformity measured with, IR transmission spectroscopy.

DESCRIPTION OF THE PREFERRED EMBODIMENT

Figure 1:
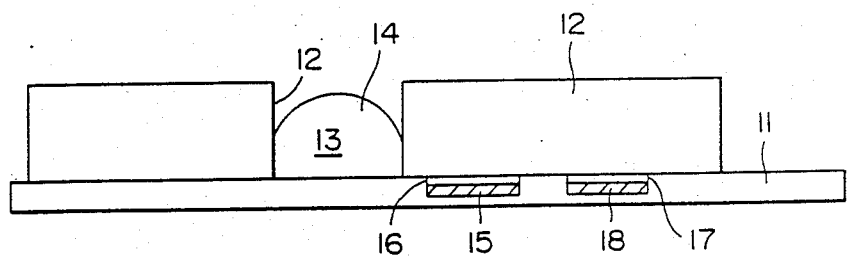
FIG. 1 is a side-view, in partial section, of a sliding member arrangement for exposing a suitable substrate to a melt for epitaxial growth.

The device shown in FIG. 1 comprises a slidable bottom member 11 and an upper graphite apparatus component 12 positioned on said lower member 11. Between the two sections of the upper member 12 there is provided a reservoir space 13 into which there is introduced the non-stoichiometric metallic solution 14 of the composition $(Hg_{1-z}Cd_zTe)_{1-y}Te_y$. A wafer 15 of pure cadmium telluride is inserted into the recess 16 of member 11, which recess is accurately machined according to the dimensions of such wafer, there remaining a distance of the order of 30 $\mu$ from the upper surface of the wafer 15 and the bottom of member 12 positioned above same. In the second similar recess 17 there is placed a highly polished single crystal wafer 18 of CdTe, of CdZnTe or of another suitable material.

To epitaxially grow $Hg_{1-x}Cd_xTe$ in the apparatus of the present invention, the graphite growth fixture, containing the $(Hg_{1-z}Cd_z)_{1-y}Te_y$ solution and the two appropriate wafers, is placed within an epitaxial reactor tube surrounded by a multi-zone furnace. Growth takes place in a flowing hydrogen environment. A generated mercury vapor is established so as to prevent evaporative mercury loss from the growth solution As the temperature of the apparatus rises to slightly above the solution liquidus, wafer 15 is positioned beneath the melt reservoir Proper conditions of melt saturation using wafer 15 are met by maintaining isothermal conditions for about one hour. Wafer 15 is subsequently removed from the solution by physically siding the graphite element 11.

The solution is cooled to a predesignated temperature below the solution liquidus, and epitaxial growth initiates isothermally when wafer 18 is positioned beneath the melt. After a period of time, an epitaxial $Hg_{1-x}Cd_xTe$ crystalline layer is grown upon wafer 18. The molten solution 14 is decanted off of wafer 18 by again repositioning the graphite 11.

A unique and advantageous characteristic of this II-VI compound crystal growth is the application of graphite components encapsulated with a sputtered silicon monoxide coating Historically, the production of silicon monoxide is credited to H. N. Potter, who described this material "Monox" as an extremely fine light brown powder, which had a multitude of applications; he patented this substance in 1905.

Hass et al. described the benefits of a low-order oxide of silicon silicon monoxide, as a means to successfully coat front-surface aluminum mirrors , so as to produce hard, adherent protective films. Such silicon monoxide films withstand high temperatures, and are chemically and mechanically resistant.

For producing quantities of stoichiometric silicon monoxide, the reaction $$SiO_2 + Si \rightarrow 2SiO$$

is employed. Quantities of very finely divided pure silicon and silicon dioxide are intimately mixed to their molecular weights. This mixture is placed within a silica combustion tube. After evacuation to at least $1 \times 10^{-4}$ mm Hg, the reaction vessel is inserted into a furnace. At about 1100° C., stoichiometric silicon monoxide evolves from the mixture and condenses onto cooler sections of the tube surfaces.

In the present invention, stoichiometric silicon monoxide is synthesized, sintered and compressed into a circular sputtering target. RF sputtering under an argon plasma has been found to be the ideal means of thin-layer SiO deposition onto graphite.

Prior to coating, graphite components are prepared by high temperature baking at 1000° C. under vacuum ($10^{-7}$ Torr) for 24 hours in a vacuum furnace.

Upon cooling, the graphite is carefully removed from the vacuum furnace and hermetically sealed under a pure inert-gas atmosphere so as to prevent the gettering of moisture or other contaminants onto the graphite surfaces during transfer to the specially prepared RF sputtering system. Prior to introducing the graphite into the sputtering system, all internal areas of the system are in-situ sputtered with silicon monoxide so as to maintain the highest purity environment for deposition . The graphite components are mounted within a specially designed vacuum housing adjacent to the 8" diameter target of pure silicon monoxide. The graphite is re-purified by in-si&u back sputter etching prior to SiO deposition. The silicon monoxide layer is deposited to a thickness of 12000–15000 Angstroms by RF sputtering under an argon partial pressure of $5 \times 10^{-3}$-$1 \times 10^{-2}$ torr with 800 W RF power.

The graphite is held at 100° C.–200° C. during the deposition process.

This sputter-deposited stoichiometric silicon monoxide graphite encapsulant has many beneficial properties making it ideal for II-VI epitaxy:

1. It is a plasma-based treatment and therefore is expected to give beter access to recesses, internal corners and surface pores, than would be expected by deposition techniques such as evaporation. Therefore, adhesion to the underlying graphite is excellent, step coverage is good, and the accuracy of internally machined corners is maintained.
2. The coating is permanent and removed only by exposure to hydrofluoric acid.
3. The coating is not wetted by most molten metallic solutions.
4. It is stable and strong at high temperatures.
5. Its resistance to abrasion is superior to that of related evaporated coatings.
6. It has high resistance to erosion.
7. It has high purity.
8. The coating is highly resistant to thermal shock.
9. The coating's low coefficient of thermal expansion makes it suitable as a graphite encapsulant, even at high temperatures, greater than 700° C.
10. Coating thickness is very uniform.
11. The morphology of the silicon monoxide coating is smooth and featureless so that contacting graphite surfaces mate with precision.
12. It is chemically inert.
13. It has high compressive strength.

This special encapsulant, used upon graphite growth components for epitaxial II–VI semiconductor crystal growths, directly facilitates the production of large area epilayers with high yield, throughput and reproducibility.

Figure 2:
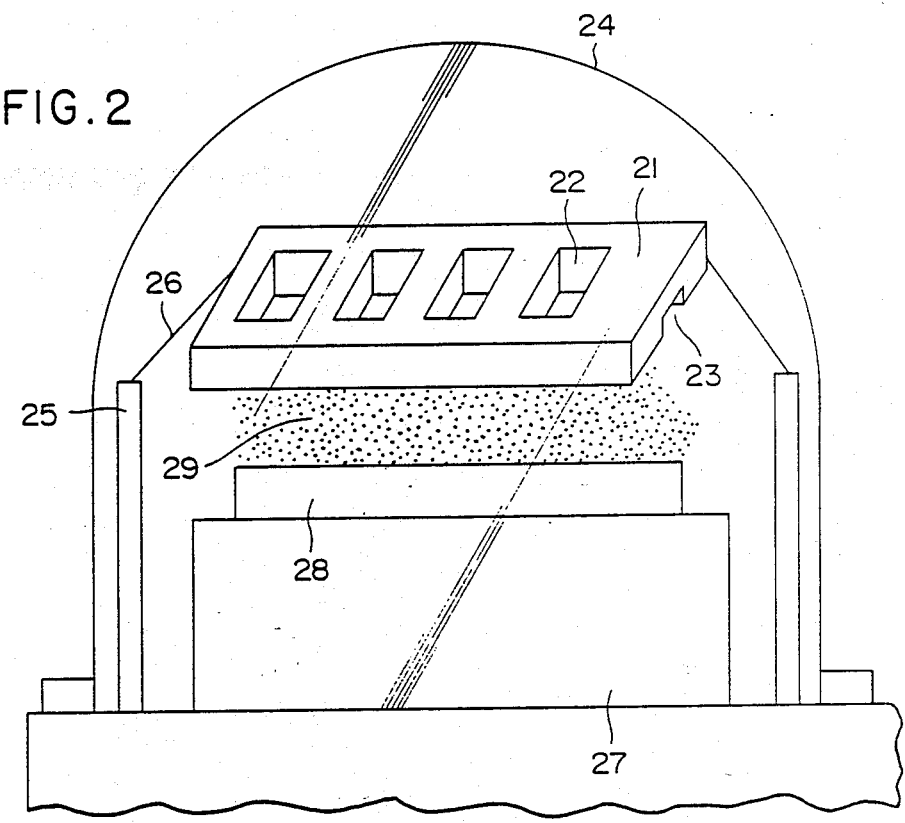
FIG. 2 is a perspective view of a device for coating a graphite member with a protective coating.
Figure 3:
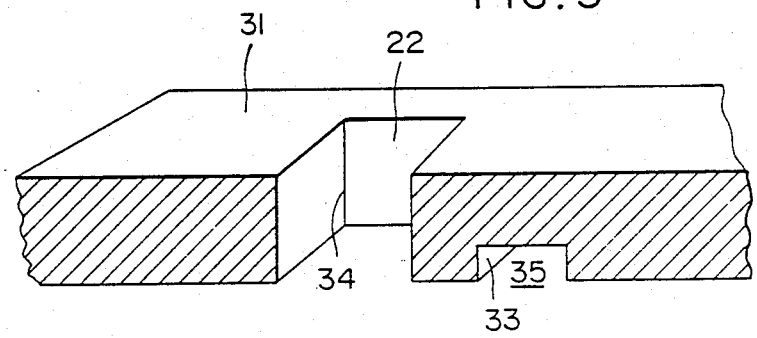
FIG. 3 is a perspective view of part of a graphite member used in the production process of the invention.
Figure 4:
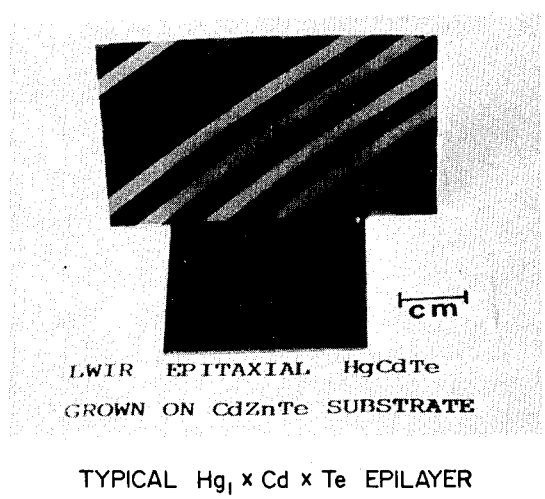
FIG. 4 illustrates a typical HgCdTe epitaxial layer grown on a CdZnTe substrate.
Figure 5:
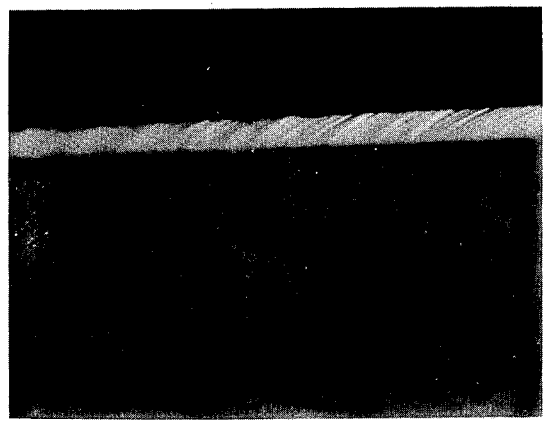
FIG. 5 is an illustration of the epilayer/substrate metallurgical interface of products of the invention.
Figure 6:
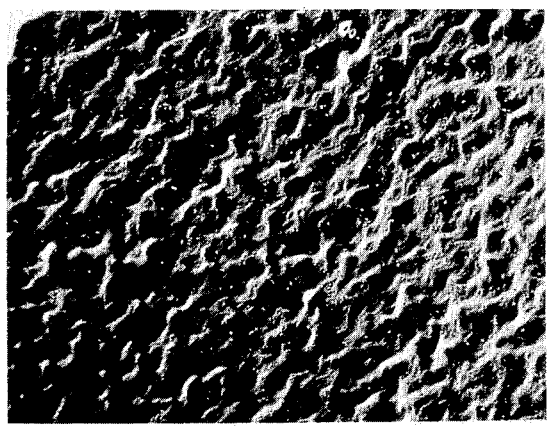
FIG. 6 illustrates epilayer micromorphology.

FIGS. 2 and 3 provide a class picture of the device used in the epitaxial growth process of the present invention, wherein:

FIG. 2 illustrates a sputter deposition device for silicon monoxide coating of graphite products. The graphite component 21, illustratively containing both accurately machined through holes 22 and internal recesses and corners 23 is positioned within the high vacuum sputter deposition chamber 24 and supported via stainless steel fixtures 25 by wires 26. RF sputtering 27 employing a pure sputtering target of sintered and compressed silicon monoxide 28 is performed using an argon plasma 29.

FIG. 3, showing a cross-sectional view of a typical machined graphite product, more clearly illustrates the silicon monoxide deposition. All exposed exterior surfaces 31, are uniformly coated with sputtered silicon monoxide. Interior surfaces, including through-holes 32 and machined recesses 33, are equally uniformly coated, as are internally machined corners 34 and 35. Dimensional accuracy of the graphite product is maintained after the sputtered coating is deposited.

Epitaxial growth:

The application of the aforementioned growth process utilizing sputtered silicon monoxide encapsulated graphite LPE components, is demonstrated by reproducible $Hg_{1-x}Cd_xTe$ epitaxial growths upon 27 mm×25 mm single crystal substrates of CdZnTe. Epitaxial layers are compositionally, physically and electrically highly uniform both laterally across the entire surface area and axially down to 2 $\mu$m from the epilayer/substrate interface. Morphology is clear and mirror-like. Epitaxial layers are highly pure with near-intrinsic background impurity levels.

High throughout and yield characterizes these epitaxial layer growths. Graphite growth components coated with sputtered silicon monoxide are free of entrapped solidified growth solutions following the crystal-growth process, and are used from growth-to-growth without intermediate purification or baking.

TABLE I demonstrates typical layer characteristics obtained according to the present invention:

TABLE I

| $Hg_{1-x}Cd_x$ Te epilayer | | |
|---|---|---|
| Substrate: | | |
| (III) CdZnTe A or B face | | |
| 27 mm × 25 mm | | |
| Single crystal | | |
| Free of twins and low angle grain boundaries | | |
| Epilayer characteristics: | | |
| Uniformity of IR Absorption Edge | | |
| at 77 K | 11.0 ± 0.03 $\mu$m over entire area | |
| Thickness | 20.0 ± 0.5 $\mu$m. | |
| Electrical characteristics at 77K after thermal treatments: | | |
| $N_A$—$N_D$ | = | $7.3 \times 10^{15}$ cm$^{-3}$ |
| Mobility | = | 730 cm$^2$/Vsec |
| Resistivity | = | 1.17 ohm · cm |
| Background purity measured at 77K | | |
| $N_D$—$N_A$ | = | $1.4 \times 10^{14}$ cm$^{-3}$ |
| Mobility | = | $1.3 \times 10^5$ cm$^2$/Vsec |
| Resistivity | = | .33 Ohm · cm |

EXAMPLE

Suitable wafers of 27 mm×25 mm size were placed in recesses 16' and 17' of the device of FIG. 1. The lower graphite member is of rectangular shape of about 300 mm by 50 mm with a height of about 7 mm. The two recesses 16 and 17 are about 700 microns deep, with their dimensions being of 27 mm by 25 mm. The height of the wafers is about 670 microns so as to leave an empty space of about 30 microns. The substrates are of approximately the same dimensions as the recesses, i.e. 27 mm×25 mm. The melt 14 is brought to a temperature of about 505° C. The melt subsequently is brought on top of wafer 15 by a sliding motion of the upper versus the lower parts of the sliding arrangement. Recess 16 is used only for preparing the liquid. Epitaxial growth takes place only in recess 17. Following melt preparation, wafer 15 is displaced away from the melt. The device is allowed to cool at a rate of 1° C./min to 495° C. The melt is then repositioned above wafer 18. The growth process takes generally about 20 minutes, and is effected under hydrogen. During this period of time an epitaxial layer of the order of 20 microns thickness can be grown in a highly uniform manner. At the end of the growth, the excess melt decants off the substrate by repositioning element 11. After cooling, the wafer is extracted from the graphite device and subsequently processed into focal plane array devices.

BIBLIOGRAPHY

U.S. PATENTS 4,366,771—1/1983—Bowers, et. al.

GERMAN PATENT

182082—(1905/1907)—H. N. Potter, et. al.

OTHER PUBLICATIONS

"Slider LPE of HgCdTe Using Mercury Pressure Controlled Growth Solutions", T. C. Harman, *Journal of Electronic Materials*, VOL. 10, No. 6, 1981

"Silicon Monoxide Protected Front-Surface Mirrors", G. Hass and N. W. Scott, *Journal of the Optical Society of America*, Vol. 39, No. 2, Feb. 1949.

I claim:
1. A process for the production of epitaxial layers of II–VI compound semiconductors on suitable substrates, wherein the epitaxial growth from a melt is effected on such substrates using graphite susceptor devices, where the surfaces of the graphite exposed to the reactants are coated with an essentially pure and uniform layer of essentially silicon mono-oxide applied to such graphite by plasma sputtering.

2. A process according to claim 1, where the substrate is CdTe, CdZnTe, or layers of CdTe or CdZnTe on foreign substrates.

3. A process according to claim 1 where the epitaxial growth of $Hg_{1-x}Cd_xTe$, $Hg_{1-x}Zn_xTe$ and other related II-VI ternary semiconductor compound is used for the production of photovoltaic or photoconductive infrared detectors.

4. A process according to claim 1, where the substrate wafer is of the size of at least 600 mm$^2$.

5. A process according to any of claims 1 to 4, where the deposition of the epitaxial layer is from a melt of $(Hg_{1-z}Cd_z)_{1-y}Te_y$ or $(Hg_{1-z}Zn_z)_{1-y}Te_y$ type compositions.

6. A process according to claim 1 where a decrease of temperature prior to isothermal epitaxial growth is at a rate of the order of 1° C./minute 7. A process according to claim 1, where a layer of about 3–5 mm of the melt covers the substrate during the epitaxial growth phase 8. A process as claimed in claim 1, where the graphite susceptor is coated with a layer of essentially plasma sputtered silicon monoxide of about 10,000 to 15,000 Å thickness.

* * * * *